(12) United States Patent
Bai et al.

(10) Patent No.: US 11,086,224 B2
(45) Date of Patent: Aug. 10, 2021

(54) FABRICATION SYSTEM OF SEMICONDUCTOR DEVICE AND METHOD OF FABRICATING A SEMICONDUCTOR DEVICE USING THE SAME

(71) Applicant: Samsung Electronics Co., Ltd., Suwon-si (KR)

(72) Inventors: Keunhee Bai, Suwon-si (KR); Jinhong Park, Yongin-si (KR); Jinseok Heo, Hwaseong-si (KR); Seungmin Lee, Hwaseong-si (KR); Suntaek Lim, Seongnam-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/676,588

(22) Filed: Nov. 7, 2019

(65) Prior Publication Data
US 2020/0348599 A1    Nov. 5, 2020

(30) Foreign Application Priority Data

May 2, 2019    (KR) .......................... 10-2019-0051676

(51) Int. Cl.
*G03F 7/20* (2006.01)
*H01L 21/268* (2006.01)

(52) U.S. Cl.
CPC ...... *G03F 7/70033* (2013.01); *G03F 7/70983* (2013.01); *H01L 21/2686* (2013.01)

(58) Field of Classification Search
CPC ............. G03F 7/70033; G03F 7/70983; H01L 21/2686
See application file for complete search history.

(56) References Cited

U.S. PATENT DOCUMENTS

| 4,712,910 A * | 12/1987 | Sakato ................... G03F 7/7055 257/E21.211 |
| 6,459,491 B1 * | 10/2002 | Nguyen ............. G01B 11/0616 356/237.1 |
| 6,753,941 B2 | 6/2004 | Visser |
| 6,781,673 B2 | 8/2004 | Moors et al. |
| 7,136,141 B2 | 11/2006 | Bakker |
| 7,161,653 B2 | 1/2007 | Bakker et al. |

(Continued)

FOREIGN PATENT DOCUMENTS

| JP | H08241847 | 9/1996 |
| JP | 2008147337 | 6/2008 |

(Continued)

*Primary Examiner* — Deoram Persaud
(74) *Attorney, Agent, or Firm* — Myers Bigel, P.A.

(57) ABSTRACT

Disclosed are a system for fabricating a semiconductor device and a method of fabricating a semiconductor device. The system may include a chamber, an extreme ultraviolet (EUV) source in the chamber and configured to generate an EUV beam, an optical system on the EUV source and configured to provide the EUV beam to a substrate, a substrate stage in the chamber and configured to receive the substrate, a reticle stage in the chamber and configured to hold a reticle that is configured to project the EUV beam onto the substrate, and a particle collector between the reticle and the optical system and configured to allow for a selective transmission of the EUV beam and to remove a particle.

17 Claims, 14 Drawing Sheets

(56) References Cited

U.S. PATENT DOCUMENTS

| | | | |
|---|---|---|---|
| 7,763,870 B2 * | 7/2010 | Ehm | G03F 7/70941 250/504 R |
| 8,084,757 B2 | 12/2011 | Wu et al. | |
| 8,115,901 B2 | 2/2012 | Hayashi | |
| 8,227,771 B2 | 7/2012 | Soer et al. | |
| 9,826,615 B2 | 11/2017 | Su et al. | |
| 10,088,761 B1 | 10/2018 | Chou et al. | |
| 10,165,664 B1 | 12/2018 | Chen et al. | |
| 2005/0275835 A1 | 12/2005 | Sogard | |
| 2006/0007414 A1 * | 1/2006 | Luttikhuis | G03F 7/70841 355/30 |
| 2007/0079525 A1 * | 4/2007 | Sogard | G03F 1/82 34/275 |
| 2008/0246939 A1 * | 10/2008 | Yonekawa | B82Y 40/00 355/53 |
| 2009/0128795 A1 * | 5/2009 | Hayashi | G03B 27/62 355/75 |
| 2010/0002220 A1 * | 1/2010 | Tanaka | G03F 7/70558 355/71 |
| 2013/0235357 A1 * | 9/2013 | Delgado | G03F 7/70908 355/30 |
| 2014/0206167 A1 | 7/2014 | Wu et al. | |
| 2014/0253887 A1 | 9/2014 | Wu et al. | |
| 2015/0049323 A1 * | 2/2015 | Bal | G03F 7/70066 355/75 |
| 2017/0060005 A1 * | 3/2017 | Chang | G03F 7/70925 |
| 2018/0164694 A1 | 6/2018 | Kim et al. | |

FOREIGN PATENT DOCUMENTS

| | | |
|---|---|---|
| JP | 2013093588 | 5/2013 |
| KR | 1020060007657 | 1/2006 |
| KR | 1020080092614 | 10/2008 |
| KR | 101183640 | 9/2012 |

\* cited by examiner

FABRICATION SYSTEM OF SEMICONDUCTOR DEVICE AND METHOD OF FABRICATING A SEMICONDUCTOR DEVICE USING THE SAME

CROSS-REFERENCE TO RELATED APPLICATIONS

This U.S. non-provisional patent application claims priority under 35 U.S.C. § 119 to Korean Patent Application No. 10-2019-0051676, filed on May 2, 2019 in the Korean Intellectual Property Office, the contents of which are hereby incorporated by reference herein in their entirety.

BACKGROUND

The present disclosure relates to a fabrication system of a semiconductor device and a method of fabricating a semiconductor device using the same, and in particular, to an EUV exposure system and a method of fabricating a semiconductor device using the same.

With the development of information technology, research and development of highly integrated semiconductor devices have been actively conducted. The integration density of the semiconductor devices strongly relies on the wavelength of the light source used in the lithography process. Laser beams, such as I-line, G-line, KrF excimer, and ArF excimer, or extreme ultraviolet (EUV) beams, whose wavelengths are shorter than the excimer laser, may be used as the light source. The EUV beam has a much higher energy than the excimer laser. Thus, the use of the EUV beam may lead to a particle contamination issue on a reticle. To prevent a failure from occurring in the lithography process, the contaminated reticle should be replaced with another reticle.

SUMMARY

An embodiment of the inventive concept provides a semiconductor fabrication system, which is configured to suppress or prevent a particle contamination issue, and a method of fabricating a semiconductor device using the same.

According to an embodiment of the inventive concept, a system for fabricating a semiconductor device may include a chamber, an extreme ultraviolet (EUV) source in the chamber and configured to generate an EUV beam, an optical system on the EUV source and configured to provide the EUV beam to a substrate, a substrate stage in the chamber and configured to receive the substrate, a reticle stage in the chamber and configured to hold a reticle that is configured to project the EUV beam onto the substrate, and a particle collector between the reticle and the optical system and configured to allow for a selective transmission of the EUV beam and to remove a particle from the reticle or from an area adjacent the reticle.

According to an embodiment of the inventive concept, a system for fabricating a semiconductor device may include a chamber, an EUV source in the chamber and configured to generate an EUV beam, an optical system on the EUV source and configured to provide the EUV beam to a substrate, a substrate stage in the chamber and configured to receive the substrate, a reticle stage in the chamber and configured to hold a reticle that is configured to project the EUV beam onto the substrate, a reticle chuck on the reticle stage and configured to hold the reticle using a electrostatic voltage, and masking blades between the reticle and the optical system. The masking blades may be configured to be charged to a bias voltage different from the electrostatic voltage.

According to an embodiment of the inventive concept, a method of fabricating a semiconductor device may include applying a electrostatic voltage to a reticle chuck of an exposure system, generating an EUV beam including an intensity having a first pulse, providing the EUV beam to a reticle, blocking a particle synchronized with the first pulse, applying a bias voltage to a masking blade of the exposure system to charge the masking blade, and providing the EUV beam to a substrate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
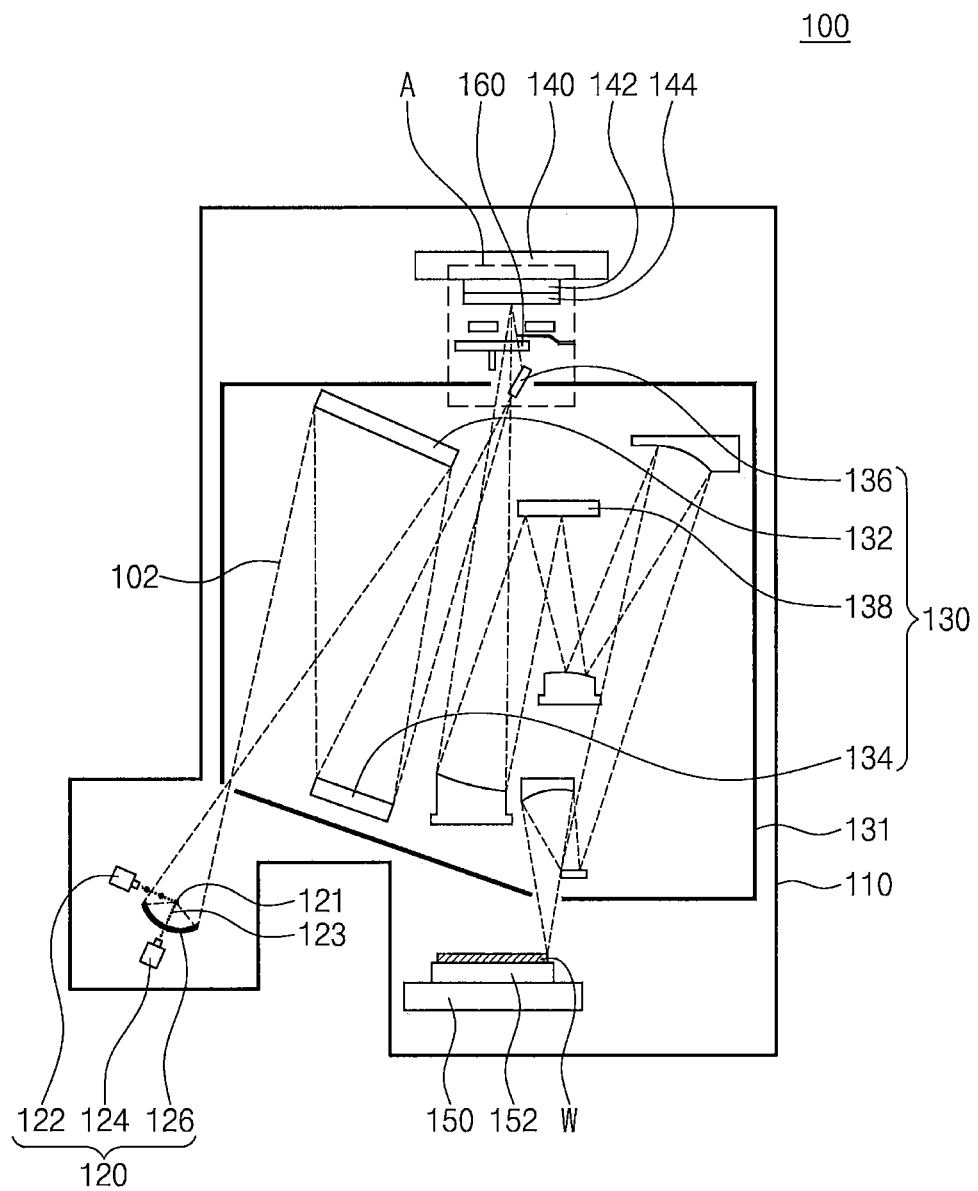
FIG. 1 is a diagram schematically illustrating an example of a system for fabricating a semiconductor device, according to an embodiment of the inventive concept.

FIG. 1 illustrates an example of a system 100 for fabricating a semiconductor device, according to an embodiment of the inventive concept.

Referring to FIG. 1, the fabrication system 100 may be an extreme ultraviolet (EUV) exposure system (e.g., scanner). Alternatively, the fabrication system 100 may be one of an ArF exposure system, a KrF exposure system, an I-line exposure system, or a G-line exposure system. In an embodiment, the fabrication system 100 may include a chamber 110, an EUV source 120, an optical system 130, a reticle stage 140, a substrate stage 150, and a particle collector 160.

The chamber 110 may define or provide a space, which is isolated from the outside, to a substrate W and a reticle 144. For example, the chamber 110 may have a vacuum state and/or may be sealed from the outside.

The EUV source 120 may be disposed in a corner portion of the chamber 110. The EUV source 120 may generate an EUV beam 102. The EUV beam 102 may be a plasma beam. As an example, the EUV source 120 may include a source drop generator 122, a laser 124, and a collector mirror 126. The source drop generator 122 may generate a source drop 121. The source drop 121 may be or include a metal liquid drop of tin (Sn), xenon (Xe) gas, titanium (Ti), or lithium (Li). The laser 124 may provide the source drop 121 to a laser beam 123 to generate the EUV beam 102. The laser beam 123 may be a pump light of the EUV beam 102. An intensity of the EUV beam 102 may be in proportion to an intensity or power of the laser beam 123.

Figure 2:
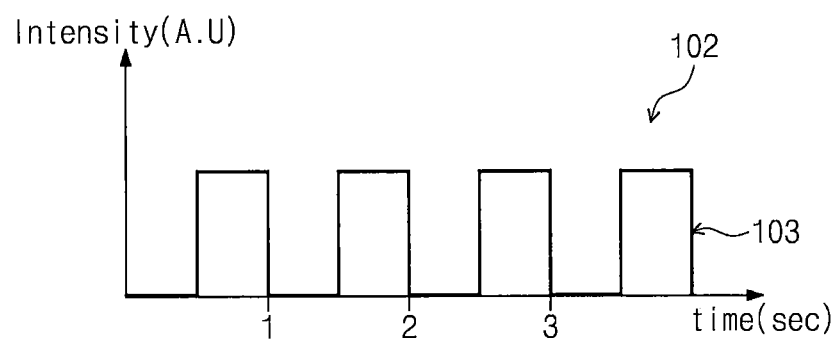
FIG. 2 is a graph showing a first pulse of an intensity of an EUV beam of FIG. 1.

FIG. 2 illustrates a first pulse 103 of an intensity of the EUV beam 102 of FIG. 1.

Referring to FIG. 2, an intensity of the EUV beam 102 may have a specific pulse (hereinafter, the first pulse 103). The first pulse 103 may have the same period as a production period of the source drop 121. In certain embodiments, the first pulse 103 may have the same period as an incidence period of the laser beam 123 incident to the source drop 121. For example, the period of the first pulse 103 may range from about 1 sec to about 3 sec.

Referring back to FIG. 1, the collector mirror 126 may focus the EUV beam 102 onto the optical system 130. For example, the collector mirror 126 may be or include a concave mirror.

The optical system 130 may be disposed between the reticle stage 140 and the substrate stage 150. The optical system 130 may be provided in a projection optical box (POB) 131. The POB 131 may be configured to allow the optical system 130 to be maintained at a high vacuum pressure (e.g., 1×10$^{-6}$ Torr). The optical system 130 may provide the EUV beam 102 sequentially to the reticle 144 and the substrate W. As an example, the optical system 130 may include a field facet mirror 132, a pupil facet mirror 134, a grazing mirror 136, and projection mirrors 138. The field facet mirror 132, the pupil facet mirror 134, and the grazing mirror 136 may be used as an illumination system for providing the EUV beam 102 to the reticle 144. The field facet mirror 132 may reflect the EUV beam 102 toward the pupil facet mirror 134. The pupil facet mirror 134 may reflect the EUV beam 102 toward the reticle 144. The field facet mirror 132 and the pupil facet mirror 134 may be configured to allow the EUV beam 102 to be collimated onto the grazing mirror 136. The grazing mirror 136 may be disposed between the pupil facet mirror 134 and the reticle 144. The grazing mirror 136 may adjust a grazing incident angle of the EUV beam 102. The projection mirrors 138 may be used as an objective lens (or a projection objective) for providing the EUV beam 102 onto the substrate W. The projection mirrors 138 may provide the EUV beam 102 onto the substrate W.

The reticle stage 140 may be disposed in an upper portion of the chamber 110. The reticle stage 140 may have a reticle chuck 142 (or the reticle chuck 142 may be on the reticle stage 140). The reticle chuck 142 may hold or fasten the reticle 144 in an electrostatic manner using a electrostatic voltage (e.g., see Vs of FIG. 9) or constant voltage. The reticle chuck 142 may be configured to change a position of the reticle 144 in a first direction X or a second direction Y, on the reticle stage 140. In an embodiment, the reticle 144 may be a reflection-type mask. The reticle 144 may reflect a fraction of the EUV beam 102 toward the projection mirrors 138 and may absorb another fraction of the EUV beam 102 (e.g., the fraction of the EUV beam 102 that is not reflected). The projection mirrors 138 may reflect a fraction of the EUV beam 102 toward the substrate W.

The substrate stage 150 may be disposed in a lower portion of the chamber 110. The substrate stage 150 may have a substrate chuck 152 (or the substrate chuck 152 may be on the substrate stage 150). The substrate chuck 152 may be used to load the substrate W thereon. The substrate chuck 152 may hold or fasten the substrate W using an electrostatic force. The substrate chuck 152 may be configured to change a position of the substrate W in the first direction X or the second direction Y, on the substrate stage 150. The substrate W may be exposed to the EUV beam 102. A region of a photoresist layer on the substrate W to be exposed by the EUV beam 102 may be determined by the pattern of the reticle 144. The motions of the substrate chuck 152 and the reticle chuck 142 may be controlled to provide the EUV beam 102 onto the entire top surface of the substrate W.

The particle collector 160 may be disposed between the optical system 130 and the reticle 144. The particle collector 160 may remove a particle (e.g., see 190 of FIG. 10) from the reticle 144 and may prevent the reticle 144 from being contaminated by the particles. The particle 190 may be a debris of the source drop 121.

Figure 3:
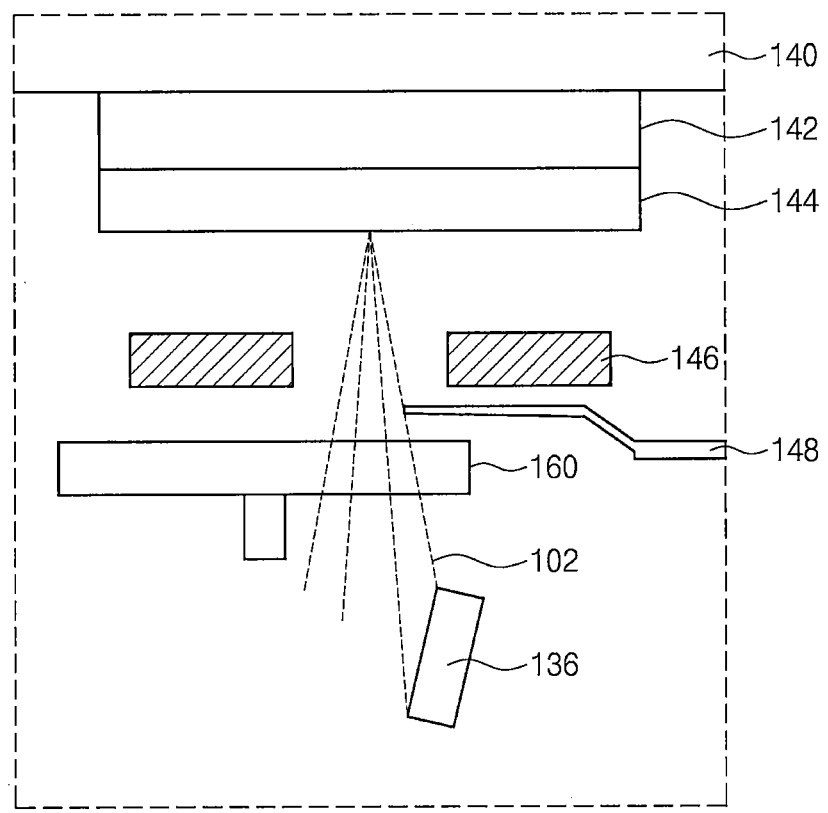
FIG. 3 is an enlarged view illustrating a portion A of FIG. 1.

FIG. 3 illustrates an enlarged structure of a portion 'A' of FIG. 1.

Referring to FIG. 3, the particle collector 160 may be disposed between the grazing mirror 136 of the optical system 130 and the reticle 144. The particle collector 160 may be placed on a propagation path of the EUV beam 102.

Figure 4:
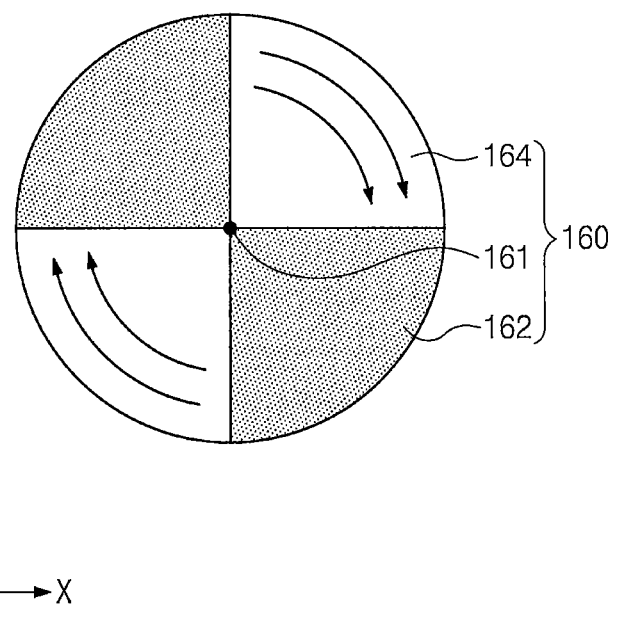
FIG. 4 is a plan view illustrating an example of a particle collector of FIG. 3.

FIG. 4 illustrates an example of the particle collector 160 of FIG. 1.

Referring to FIGS. 3 and 4, the particle collector 160 may be a rotation disk chopper. As an example, the particle collector 160 may include a rotation axis 161, a blocking region 162, and a transmitting region 164. The rotation axis 161 may be disposed at a center of the particle collector 160. The rotation axis 161 may be disposed in the blocking region 162 and the transmitting region 164. The blocking region 162 and the transmitting region 164 may have a circular arc shape. Portions of the blocking region 162 and the transmitting region 164 may each have a shape of a sector or quadrant of a circle, and portions of the blocking region 162 and the transmitting region 164 may alternate in a circumferential direction around the particle collector 160. For example, there may be two portions of the blocking region 162 each having a shape of a quadrant of a circle and two portions of the transmitting region 164 each having a shape of a quadrant of a circle. The blocking region 162 and the transmitting region 164 may have substantially the same area. The blocking region 162 and the transmitting region 164 may rotate periodically around the rotation axis 161.

The blocking region 162 may absorb and/or block the EUV beam 102. In addition, the blocking region 162 may prevent the particle 190 (e.g., see FIG. 10) from being supplied onto the reticle 144. The blocking region 162 may block the particle 190 from the reticle 144. In an embodiment, the blocking region 162 may be formed of or include a metallic material (e.g., SUS), but the inventive concept is not limited to this example. If the blocking region 162 is provided between the reticle 144 and the grazing mirror 136, the particle 190 may be removed from a surface of the reticle 144.

The transmitting region 164 may be configured to allow the BUV beam 102 to pass therethrough. The transmitting region 164 may be or include an empty space between the blocking region 162. If the transmitting region 164 is provided between the reticle 144 and the grazing mirror 136, the EUV beam 102 may be provided to the reticle 144.

Figure 5:
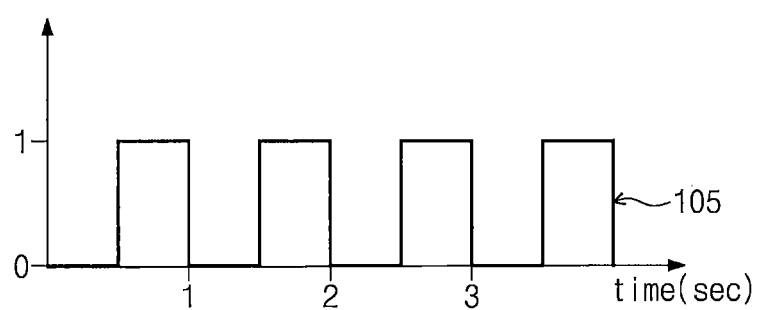
FIG. 5 is a graph showing a second pulse corresponding to a rotation period of a blocking region and a transmitting region of FIG. 4.

FIG. 5 illustrates a second pulse 105 corresponding to a rotation period of the transmitting region 164 of FIG. 4.

Referring to FIG. 5, the transmitting region 164 may rotate in a periodic manner, and such a periodic rotation of the transmitting region 164 may be described as a specific pulse. For example, the rotation of the transmitting region 164 may be described by the second pulse 105 shown in FIG. 5. The second pulse 105 may be the same as the first pulse 103 or may be synchronized with the first pulse 103 (FIG. 2). In other words, the second pulse 105 may have the same period as the period of the first pulse 103 and may have the same phase as the phase of the first pulse 103. The period of the second pulse 105 may range from about 1 sec to about 3 sec. The pulse of the blocking region 162 may have the same period as the period of the second pulse 105 and may have a phase opposite to the phase of the second pulse 105.

If the EUV beam 102 is generated, the transmitting region 164 may be provided between the reticle 144 and the grazing mirror 136. The EUV beam 102 may be provided to the reticle 144. The EUV beam 102 may be reflected to the substrate W by the reticle 144.

If the EUV beam 102 is not generated, the blocking region 162 may be provided between the reticle 144 and the grazing mirror 136. The blocking region 162 may remove the particle 190 (e.g., see FIG. 10) between the reticle 144 and the grazing mirror 136. It may be possible to prevent or suppress the reticle 144 from being contaminated by the particle 190.

Referring back to FIG. 3, masking blades 146 (or reticle masking blades) may be provided between the particle collector 160 and the reticle 144. As an example, the masking blades 146 may define an exposure region and/or a reflection region of the EUV beam 102. The masking blades 146 may be formed of or include a metallic material (e.g., SUS) or a ceramic material.

In addition, a uniformity corrector 148 may be provided between the masking blades 146 and the particle collector 160. The uniformity corrector 148 may be configured to mechanically absorb a fraction of the BUV beam 102 and may adjust uniformity of the BUV beam 102. Alternatively, the uniformity corrector 148 may be configured to adjust an intensity of the EUV beam 102 in some other manner.

Figure 6:
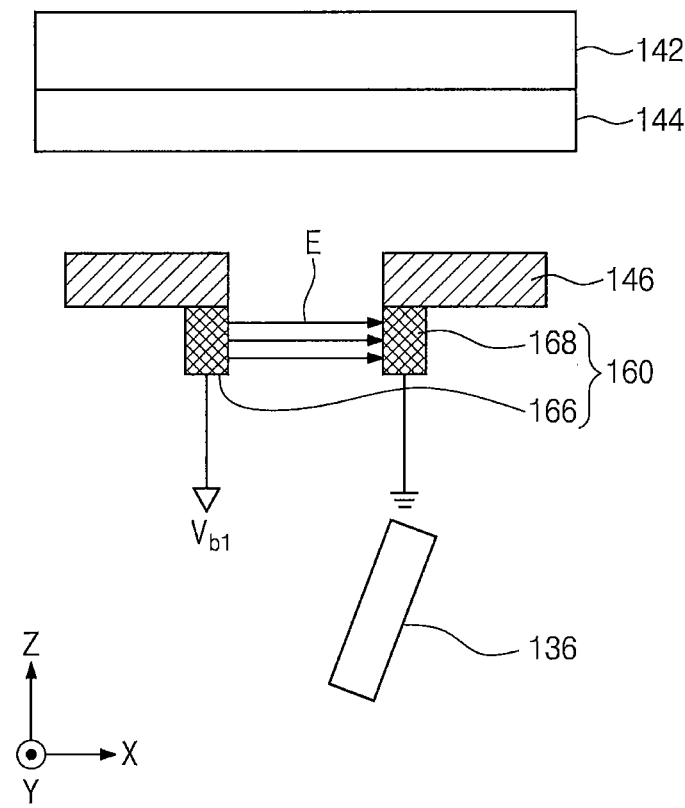
FIG. 6 is a diagram illustrating another example of a particle collector of FIG. 1.

FIG. 6 illustrates another example of the particle collector 160 of FIG. 1.

Referring to FIG. 6, the particle collector 160 may induce an electric field E, which is used to block or remove the particle (e.g., see 190 of FIG. 10), between the masking blades 146. As an example, the particle collector 160 may include a bias electrode 166 and a ground electrode 168. The bias electrode 166 and the ground electrode 168 may be fastened to bottom surfaces of the masking blades 146, respectively. In the case where the masking blades 146 are made of a metallic material, the bias electrode 166 and the ground electrode 168 may be electrically separated from the masking blades 146 by an insulating material. In the case where the masking blades 146 are made of ceramic, the bias electrode 166 and the ground electrode 168 may be directly attached or adhered to the masking blades 146. In some embodiments, the masking blades 146 include first and second masking blades. The bias electrode 166 may be on the first masking blade and the ground electrode may be on the second masking blade.

The bias electrode 166 may induce the electric field E using a first bias voltage Vb1. The electric field E may be induced between the masking blades 146. The electric field E may be used to remove the particle 190.

Figure 7:
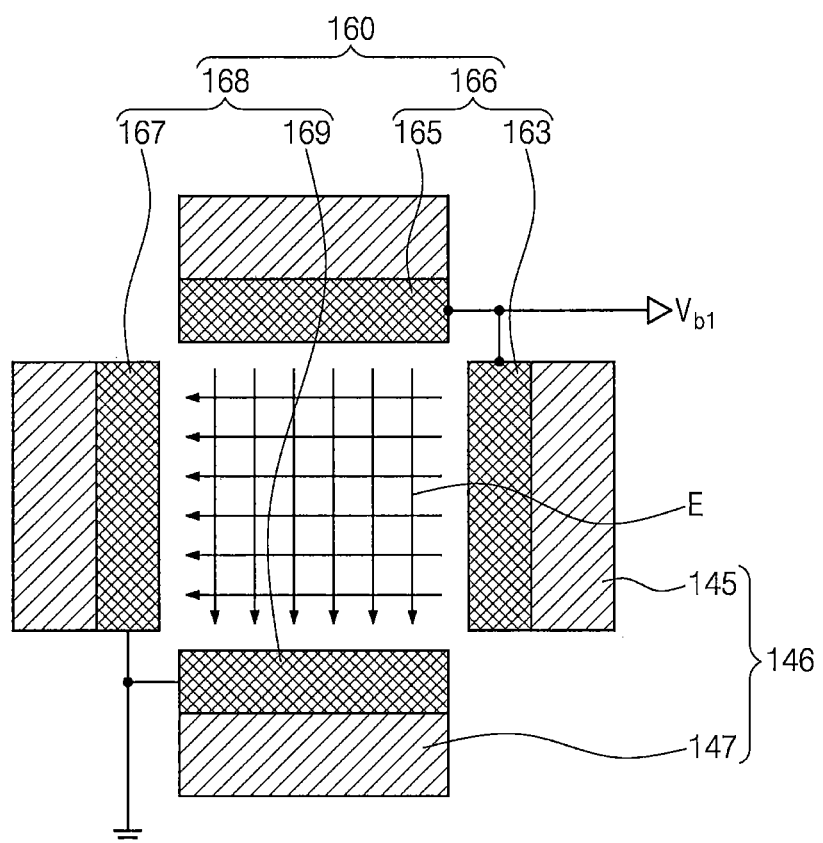
FIG. 7 is a plan view illustrating masking blades, a bias electrode, and a ground electrode of FIG. 6 according to example embodiments.

FIG. 7 illustrates an example of the masking blades 146, the bias electrode 166, and the ground electrode 168 of FIG. 6.

Referring to FIG. 7, the masking blades 146 may include first masking blades 145 (also referred to herein as first and second masking blades) and second masking blades 147 (also referred to herein as third and fourth masking blades). The first masking blades 145 (or the first and second masking blades) may be disposed to face each other in the first direction X. The first masking blades 145 may be moved toward or away from each other in the first direction X to adjust the exposure region of the EUV beam 102 in the first direction X. The second masking blades 147 (or the third and fourth masking blades) may be disposed to face each other in the second direction Y. The second masking blades 147 may be moved toward or away from each other in the second direction Y to adjust the exposure region of the EUV beam 102 in the second direction Y.

The bias electrode 166 may be disposed on one of the first masking blades 145 and one of the second masking blades 147. As an example, the bias electrode 166 may include a first bias electrode 163 and a second bias electrode 165. The first bias electrode 163 and the second bias electrode 165 may be disposed adjacent to each other and may be electrically connected to each other. The first bias electrode 163 may be disposed on one of the first masking blades 145. The second bias electrode 165 may be disposed on one of the second masking blades 147.

The ground electrode 168 may be disposed on another one of the first masking blades 145 and on another one of the second masking blades 147. As an example, the ground electrode 168 may include a first ground electrode 167 and a second ground electrode 169. The first ground electrode 167 and the second ground electrode 169 may be disposed adjacent to each other and may be grounded.

The first ground electrode 167 may be disposed on another one of the first masking blades 145. The first ground electrode 167 may be disposed to face the first bias electrode 163 in the first direction X. The first bias electrode 163 and the first ground electrode 167 may induce the electric field E, which is used to remove the particle 190, in the first direction X.

The second ground electrode 169 may be disposed on another one of the second masking blades 147. The second ground electrode 169 may be disposed to face the second bias electrode 165 in the second direction Y. The second bias electrode 165 and the second ground electrode 169 may induce the electric field E, which is used to remove the particle 190, the second direction Y.

In some embodiments, the first masking blades 145 include first and second masking blades and the second masking blades 147 include third and fourth masking blades. The first bias electrode 163 may be on the first masking blade. The second bias electrode 165 may be on one of the third masking blade. The first ground electrode 167 may be on the second masking blade. The second ground electrode 169 may be on the fourth masking blade.

Figure 8:
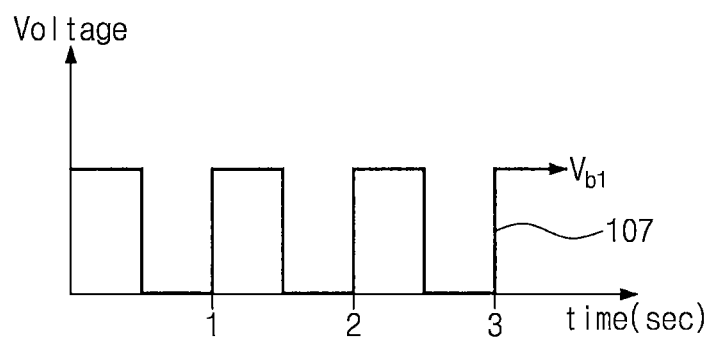
FIG. 8 is a graph showing a third pulse of a first bias voltage of FIG. 6.

FIG. 8 illustrates a third pulse 107 of the first bias voltage Vb1 of FIG. 6.

Referring to FIG. 8, the first bias voltage Vb1 may have a specific pulse (hereinafter, the third pulse 107). The third pulse 107 may have the same period as the period of the first pulse 103 (FIG. 2). In an embodiment, the period of the third pulse 107 may range from about 1 sec to about 10 sec. The third pulse 107 may have a phase opposite to the phase of the first pulse 103. The EUV beam 102 and the electric field E may be turned on or off in an opposite manner. For example, if the EUV beam 102 is turned on, the electric field E may be turned off. The EUV beam 102 may pass through a region between the bias electrode 166 and the ground electrode 168. If the EUV beam 102 is turned off, the electric field E may be turned on. The particle 190 may be blocked or removed by the electric field E.

Figure 9:
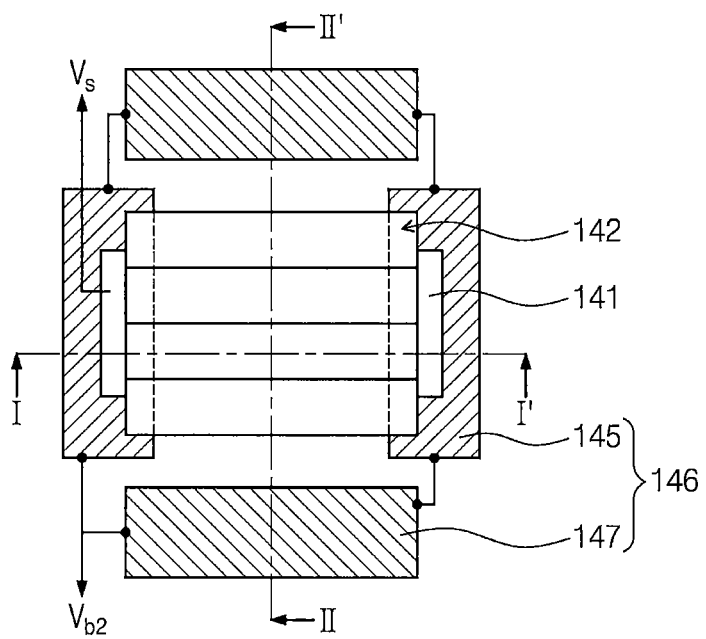
FIG. 9 is a plan view illustrating a reticle chuck and masking blades of FIG. 3 according to example embodiments.
Figure 10:
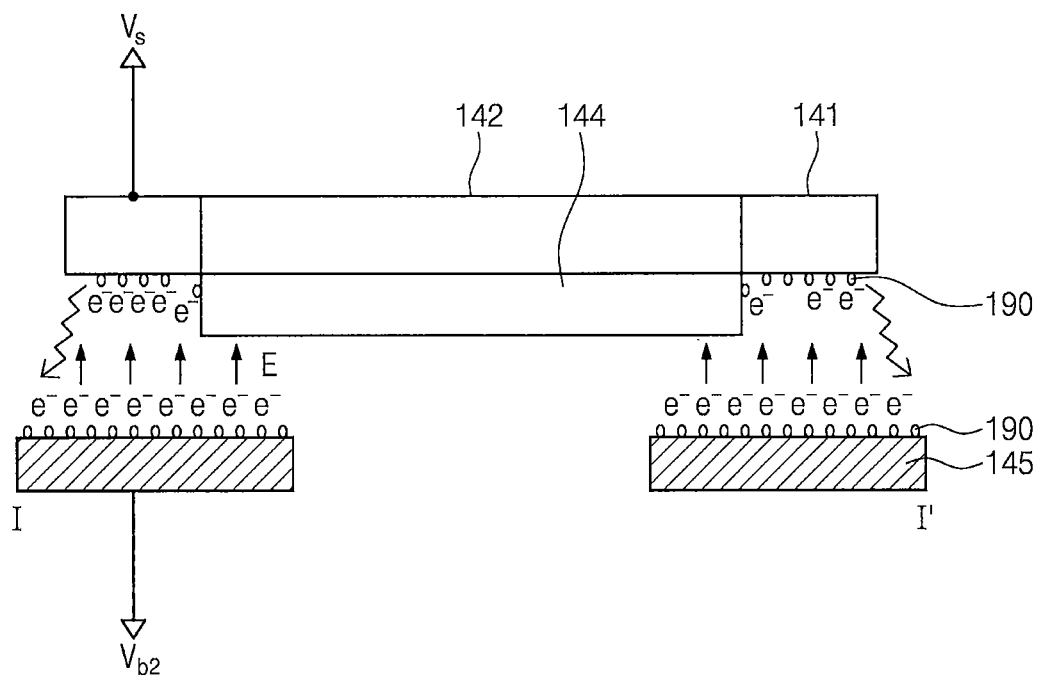
FIGS. 10 and 11 are sectional views, which are respectively taken along lines I-I' and II-II' of FIG. 9.
Figure 11:
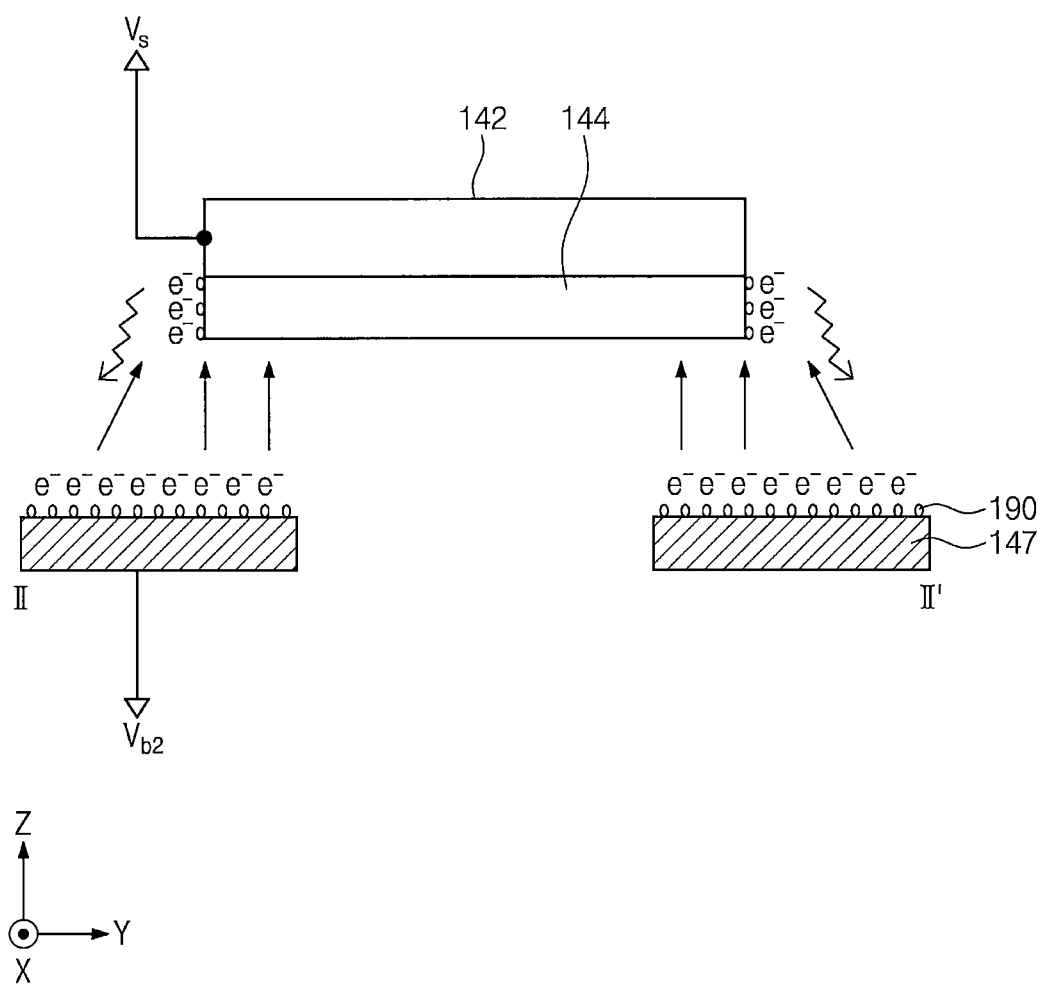

FIG. 9 illustrates an example of the reticle chuck 142 and the masking blades 146 of FIG. 3. FIGS. 10 and 11 illustrate sectional views, which are respectively taken along lines I-I' and II-II' of FIG. 9.

Referring to FIGS. 9 to 11, the reticle chuck 142 may be applied with a electrostatic voltage Vs, and the masking blades 146 may be applied with a second bias voltage Vb2. In an embodiment, the reticle chuck 142 may be divided into a plurality of regions (e.g., four regions), to which the electrostatic voltage Vs of different polarities are applied. The polarity of the electrostatic voltage Vs may be periodically changed.

Figure 12:
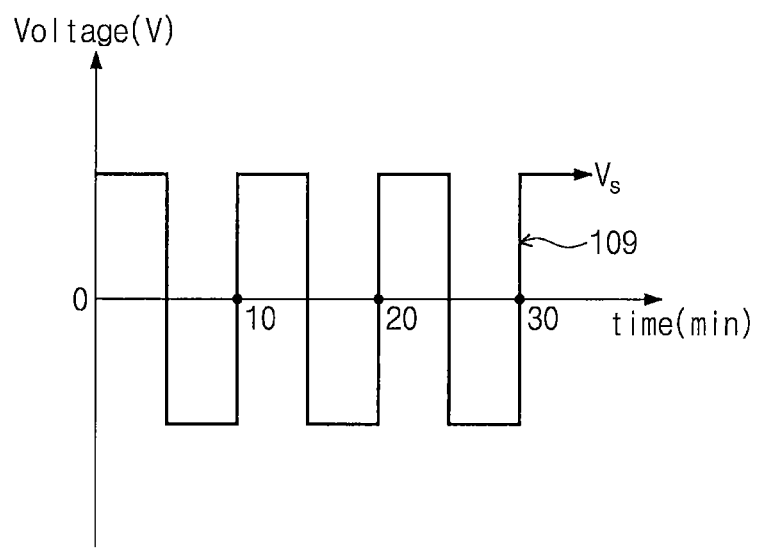
FIG. 12 is a graph showing a fourth pulse of a electrostatic voltage of FIG. 9.

FIG. 12 illustrates a fourth pulse 109 of the electrostatic voltage Vs of FIG. 9.

Referring to FIG. 12, the electrostatic voltage Vs may have a specific pulse (hereinafter, the fourth pulse 109). The period of the fourth pulse 109 may range from about 10 min to 20 min. The polarity of the electrostatic voltage Vs may be periodically changed by the fourth pulse 109.

Referring back to FIGS. 9 to 11, in the case where the polarity of the electrostatic voltage Vs is periodically changed, electrically charged particles 190 may be produced near the reticle 144. The particles 190 may be negatively charged (e.g., by electrons e). The first masking blades 145 and the second masking blades 147 may be electrically connected to each other. The first masking blades 145 and the second masking blades 147 may be positively charged by the second bias voltage Vb2 to remove the particles 190, which are negatively charged.

Referring to FIG. 9, the reticle chuck 142 may include terminals 141 for receiving the electrostatic voltage Vs. The terminals 141 may be disposed at opposite edges or sides of the reticle chuck 142 in the first direction X.

Referring to FIG. 10, the particles 190 may be mainly produced on bottom surfaces of the terminals 141 and on the side surface of the reticle 144. The first masking blades 145 may receive the second bias voltage Vb2 and may induce the electric field E into the reticle 144 and the terminals 141. The first masking blades 145 may adsorb and/or remove the particle(s) 190 using the electric field E.

Referring to FIG. 11, the second masking blades 147 may receive the second bias voltage Vb2 and may induce the electric field E into the reticle 144. The second masking blades 147 may adsorb and/or remove the particle(s) 190 on the side surface of the reticle 144.

Figure 13:
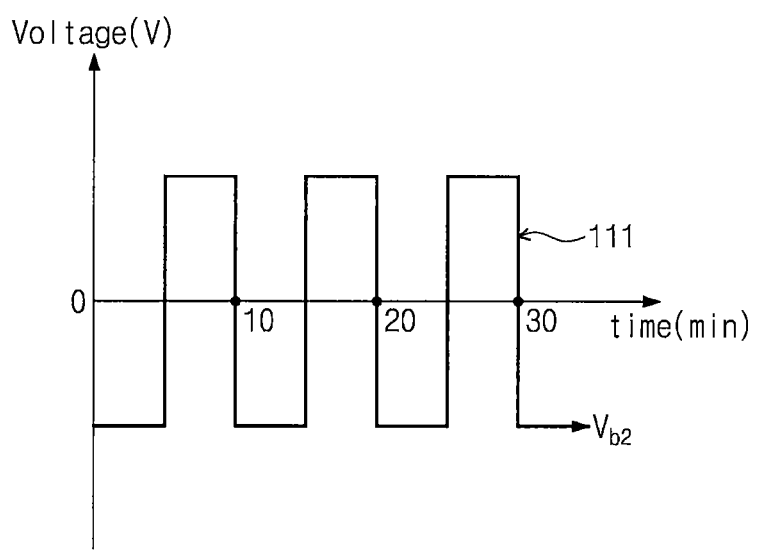
FIG. 13 is a graph showing a fifth pulse of a second bias voltage of FIG. 9.

FIG. 13 illustrates a fifth pulse 111 of the second bias voltage Vb2 of FIG. 9.

Referring to FIG. 13, the second bias voltage Vb2 may have a specific pulse (hereinafter, the fifth pulse 111). The fifth pulse 111 may have the same period as the period of the fourth pulse 109 of the electrostatic voltage Vs (FIG. 12). The period of the fifth pulse 111 may range from about 10 min to about 20 min. The fifth pulse 111 may have a phase opposite to the phase of the fourth pulse 109. The polarity of the electrostatic voltage Vs may be opposite to the polarity of the second bias voltage Vb2. For example, if the polarity of the electrostatic voltage Vs is negative, the polarity of the second bias voltage Vb2 may be positive. If the polarity of the electrostatic voltage Vs is positive, the polarity of the second bias voltage Vb2 may be negative. In the case where the polarity of the electrostatic voltage Vs is opposite to the polarity of the second bias voltage Vb2, a voltage difference between the electrostatic voltage Vs and the second bias voltage Vb2 may be maximized. In the case where the voltage difference between the electrostatic voltage Vs and the second bias voltage Vb2 is maximized or increased, it may be possible to increase the removal efficiency of the particle 190.

Figure 14:
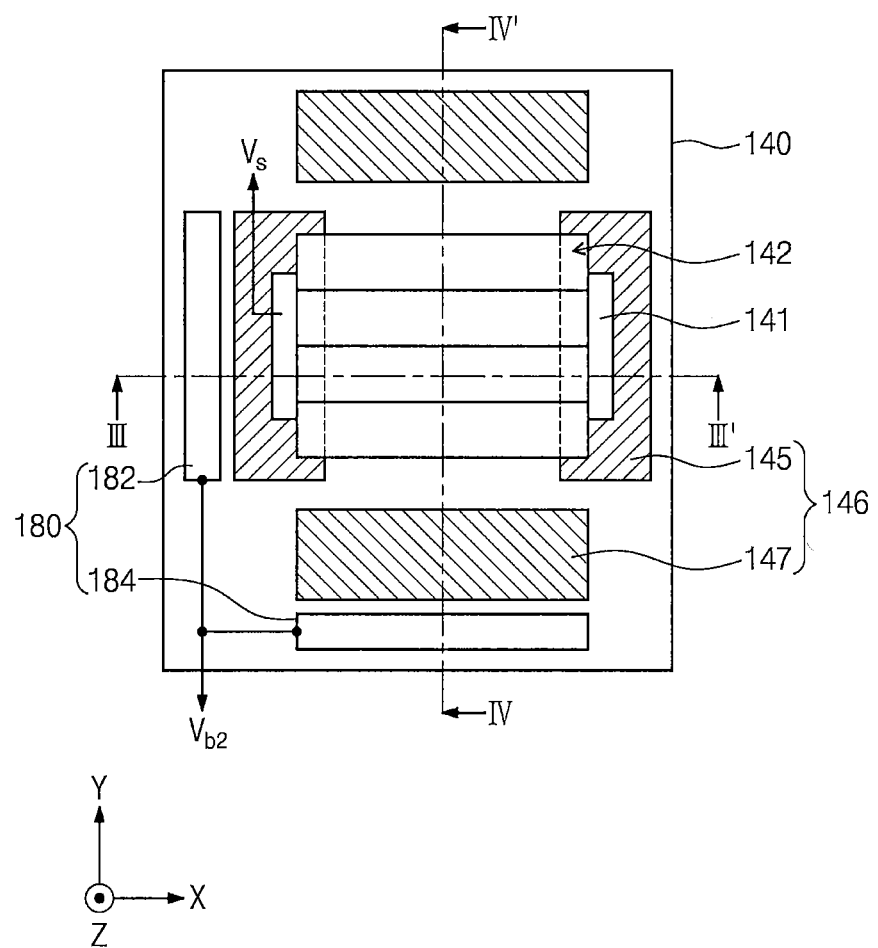
FIG. 14 is a plan view showing fluid nozzles adjacent to masking blades of FIG. 4.
Figure 15:
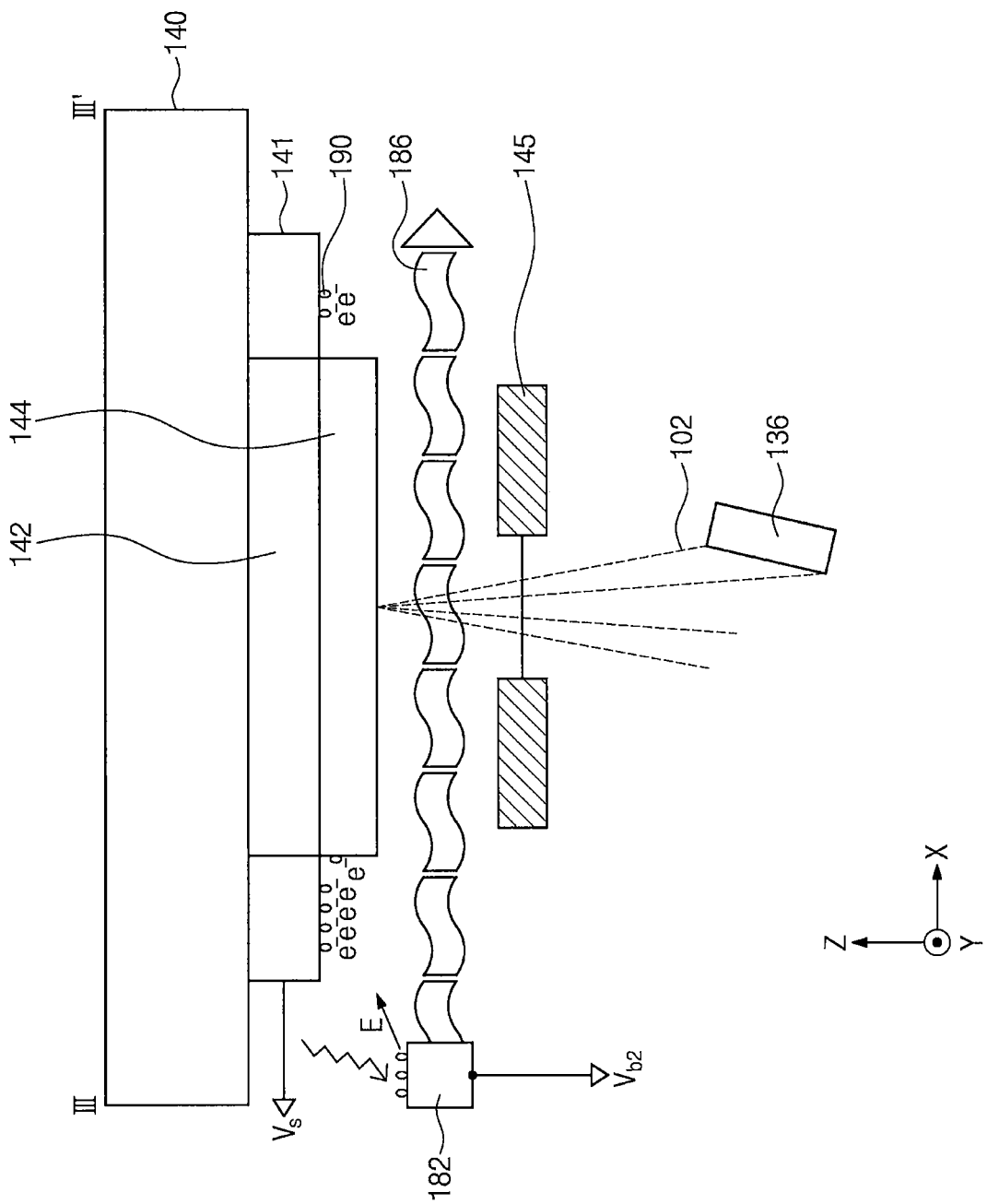
FIGS. 15 and 16 are sectional views, which are respectively taken along lines III-III' and IV-IV' of FIG. 14.
Figure 16:
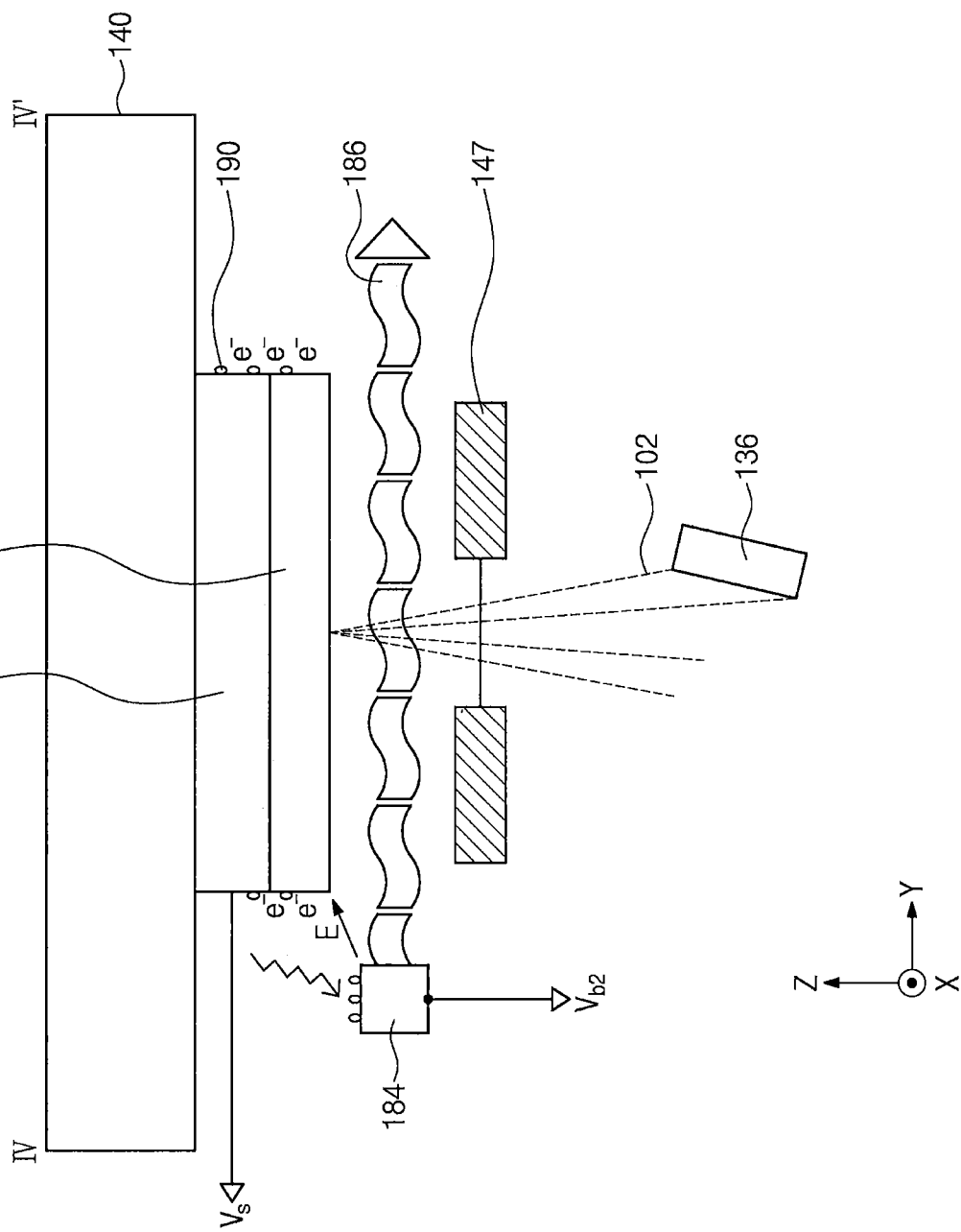

FIG. 14 illustrates fluid nozzles 180, which are disposed adjacent to the masking blades 146 of FIG. 9. FIGS. 15 and 16 illustrate sectional views, which are respectively taken along lines III-III' and IV-IV' of FIG. 14.

Referring to FIGS. 14 to 16, the fluid nozzles 180 may be disposed adjacent to the masking blades 146. The fluid nozzles 180 may inject or provide a fluid 186 into a region between the masking blades 146 and the reticle 144 to remove the particle 190 from the bottom surface of the reticle 144. For example, the fluid 186 may include hydrogen gas. As an example, the fluid nozzles 180 may include a first fluid nozzle 182 and a second fluid nozzle 184. The first fluid nozzle 182 and the second fluid nozzle 184 may be disposed between the reticle 144 and the masking blades 146 in a third direction Z. The first fluid nozzle 182 may be disposed adjacent or near one of the first masking blades 145. The first fluid nozzle 182 may provide the fluid 186 in the first direction X. The second fluid nozzle 184 may be disposed adjacent or near one of the second masking blades 147. The second fluid nozzle 184 may provide the fluid 186 in the second direction Y.

Referring to FIG. 14, the first fluid nozzle 182 and the second fluid nozzle 184 may be electrically connected to each other. The first fluid nozzle 182 and the second fluid nozzle 184 may receive the second bias voltage Vb2.

Referring to FIG. 15, the first fluid nozzle 182 may induce the electric field E into the bottom surface of the terminal 141 and the side surface of the reticle 144, using the second bias voltage Vb2. The electric field E may adsorb and/or remove the particle 190 on the bottom surface of the terminal 141 and the side surface of the reticle 144.

Referring to FIG. 16, the second fluid nozzle 184 may induce the electric field E into the side surface of the reticle 144, using the second bias voltage Vb2. The electric field E may adsorb and/or remove the particle 190.

The fabrication system 100 may be used to fabricate a semiconductor device. Hereinafter, such a fabrication method will be described in more detail.

Figure 17:
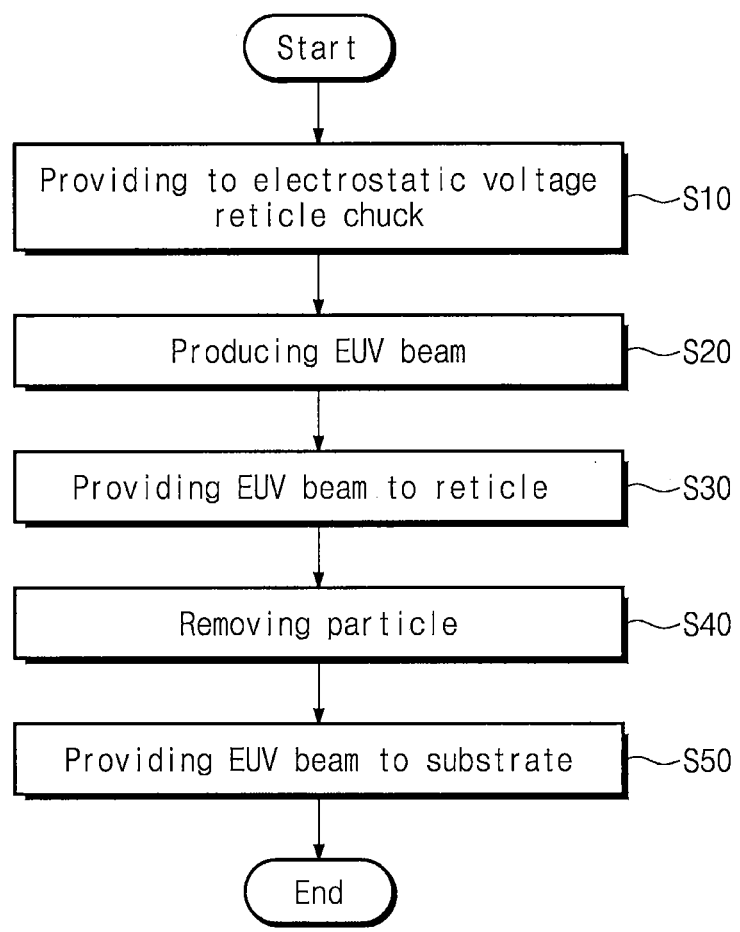
FIG. 17 is a flow chart illustrating a method of fabricating a semiconductor device, according to an embodiment of the inventive concept.

FIG. 17 illustrates a method of fabricating a semiconductor device, according to an embodiment of the inventive concept.

Referring to FIG. 17, a method of fabricating a semiconductor device according to an embodiment of the inventive concept may include providing the electrostatic voltage Vs to the reticle chuck 142 (in S10), producing the EUV beam 102 (in S20), providing the EUV beam 102 to the reticle 144 (in S30), removing the particle 190 (in S40), and providing the EUV beam 102 to the substrate W (in S50).

If the electrostatic voltage Vs is provided to the reticle chuck 142, the reticle chuck 142 may hold or fasten the reticle 144 (in S10). A polarity of the electrostatic voltage Vs may be periodically changed by the fourth pulse 109.

Thereafter, the EUV source 120 may produce the EUV beam 102 (in S20). The EUV beam 102 may have an intensity of the first pulse 103. The EUV beam 102 may be periodically turned on or off by the first pulse 103.

Next, the optical system 130 may provide the EUV beam 102 to the reticle 144 (in S30). The field facet mirror 132, the pupil facet mirror 134, and the grazing mirror 136 of the optical system 130 may reflect the EUV beam 102 toward the reticle 144.

Thereafter, the particle collector 160, the masking blades 146, and the fluid nozzles 180 may be used to remove the particle 190 (in S40).

Figure 18:
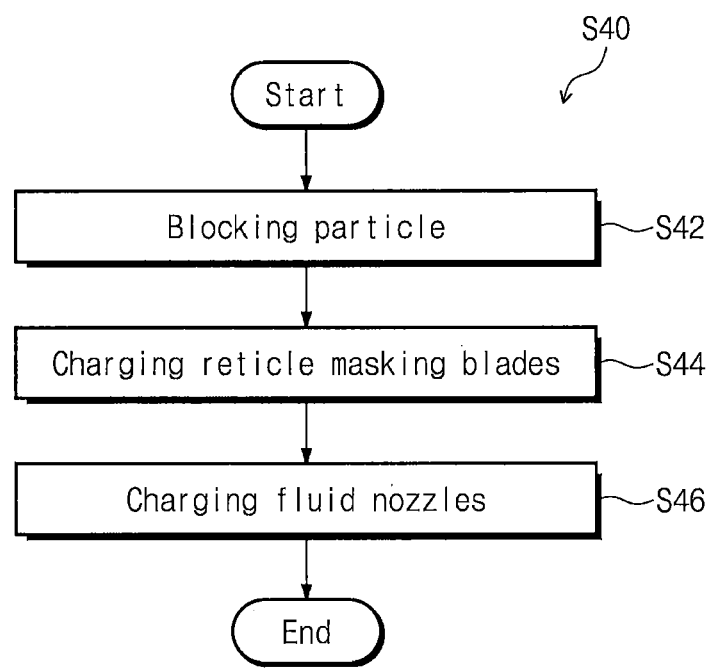
FIG. 18 is a flow chart illustrating an example of removing a particle, shown in FIG. 17.

FIG. 18 is a flow chart illustrating an example of the step S40 of removing the particle 190, shown in FIG. 17.

Referring to FIG. 18, the removing of the particle 190 (in S40) may include blocking the particle 190 (in S42), charging the masking blades 146 (in S44), and charging the fluid nozzles 180 (in S46).

First, the particle collector 160 may block the particle 190 (in S42). The particle collector 160 of the rotation disk chopper may periodically block the particle 190 using the blocking region 162. The transmitting region 164 of the particle collector 160 may have a rotation period of the second pulse 105. The second pulse 105 may be the same or almost the same as the first pulse 103. In addition, the bias electrode 166 and the ground electrode 168 of the particle collector 160 may induce the electric field E with a period of the third pulse 107 to block the particle. The third pulse 107 may have the same period as the period of the first pulse 103 and may have a phase opposite to the phase of the first pulse 103.

In addition, if the second bias voltage Vb2 is provided to the masking blades 146, the masking blades 146 may be electrically charged (in S44). The second bias voltage Vb2 may have the fifth pulse 111. The fifth pulse 111 may have the same period as the period of the fourth pulse 109 and may have a phase opposite to the phase of the fourth pulse 109. The masking blades 146 may induce the electric field E near the bottom surfaces of the terminals 141 and the side surface of the reticle 144 and may remove the particle(s) 190. In addition, the masking blades 146 may define the exposure region and/or the reflection region of the EUV beam 102 in the first direction X and the second direction Y.

If the second bias voltage Vb2 is provided to the fluid nozzles 180, the fluid nozzles 180 may be electrically charged (in S46). The fluid nozzles 180 may induce the electric field E near the bottom surfaces of the terminals 141 and the side surface of the reticle 144, using the electric field E of the second bias voltage Vb2, and may remove the particle(s) 190. In addition, the fluid nozzles 180 may provide the fluid 186 on the reticle 144 to reduce a contamination issue caused by the particle(s) 190.

All or at least one of steps of blocking the particle 190 (in S42), charging the masking blades 146 (in S44), and charging the fluid nozzles 180 (in S46) may be performed, during the removing of the particle 190 (in S40).

Referring to FIG. 17, the reticle 144 and the projection mirrors 138 may provide the EUV beam 102 onto the substrate W (in S50). A region of a photoresist layer on the substrate W to be exposed by the EUV beam 102 may be determined by the pattern of the reticle 144.

As described above, the system for fabricating a semiconductor device, according to an embodiment of the inventive concept, may include the particle collector, which is provided between the reticle and the optical system to prevent or reduce a particle contamination issue from occurring on the reticle.

While example embodiments of the inventive concept have been particularly shown and described, it will be understood by one of ordinary skill in the art that variations in form and detail may be made therein without departing from the spirit and scope of the attached claims.

What is claimed is:

1. A system for fabricating a semiconductor device, the system comprising:
a chamber;
an extreme ultraviolet (EUV) source in the chamber and configured to generate an EUV beam having an intensity of a first pulse;
an optical system above or on the EUV source and configured to provide the EUV beam to a substrate;
a substrate stage in the chamber and configured to receive the substrate;
a reticle stage in the chamber and configured to hold a reticle that is configured to project the EUV beam onto the substrate;
masking blades between the reticle and the optical system;
a particle collector between the reticle and the optical system and configured to allow for a selective transmission of the EUV beam and to remove a particle from the reticle or from an area adjacent the reticle; and
a uniformity corrector between the masking blades and the particle collector,
wherein the EUV source comprises:
a droplet generator configured to provide generate a source droplet; and
a laser device configured to periodically illuminate a laser beam into the source droplet based on the first pulse to generate the EUV beam,
wherein the particle collector comprises a rotation disk chopper having a transmitting region and a blocking region for the EUV beam,
wherein the transmitting region is configured to be rotated to have a second pulse that has a second period that is the same as a first period of the first pulse,
wherein the transmitting region is provided on the reticle when the laser device turns on the laser beam to generate the EUV beam, and
wherein the blocking region is provided on the reticle to remove the particle from the reticle or from the area adjacent the reticle when the laser device turns off the laser beam to make the EUV beam disappear.

2. The system of claim 1,
wherein the particle collector is between the masking blades and the optical system.

3. The system of claim 2, wherein the optical system comprises:
  facet mirrors between the EUV source and the reticle and configured to reflect the EUV beam; and
  a grazing mirror between the facet mirrors and the reticle and configured to reflect the EUV beam toward the reticle,
  wherein the particle collector is between the masking blades and the grazing mirror.

4. The system of claim 2, wherein the particle collector is connected or fastened to a bottom surface of the masking blades.

5. The system of claim 2, wherein the particle collector comprises:
  a ground electrode; and
  a bias electrode spaced apart from the ground electrode and configured to induce an electric field between the masking blades using a bias voltage.

6. The system of claim 5, wherein an intensity of the EUV beam has a first pulse, and
  the bias voltage has a third pulse that has a third period that is the same as a first period of the first pulse and has a third phase opposite to a first phase of the first pulse.

7. The system of claim 5, wherein the masking blades comprise:
  first and second masking blades facing each other and spaced apart in a first direction; and
  third and fourth masking blades facing each other and spaced apart in a second direction that is perpendicular to the first direction,
  the ground electrode comprises a first ground electrode on the second masking blade and a second ground electrode on the fourth masking blade, and
  the bias electrode comprises a first bias electrode on the first masking blade and a second bias electrode on the third masking blade.

8. The system of claim 2, wherein the masking blades are configured to be electrically charged by a bias voltage.

9. The system of claim 2, further comprising fluid nozzles between the masking blades and the reticle stage and configured to provide a fluid in a region between the reticle and the masking blades,
  wherein the fluid nozzles are configured to be electrically charged by a bias voltage.

10. A system for fabricating a semiconductor device, the system comprising:
  a chamber;
  an EUV source in the chamber and configured to generate an EUV beam having an intensity of a first pulse;
  an optical system on the EUV source and configured to provide the EUV beam to a substrate;
  a substrate stage in the chamber and configured to receive the substrate;
  a reticle stage in the chamber and configured to hold a reticle that is configured to project the EUV beam onto the substrate;
  a reticle chuck on the reticle stage and configured to hold the reticle using an electrostatic voltage;
  masking blades between the reticle and the optical system;
  a particle collector between the reticle and the optical system and configured to allow for a selective transmission of the EUV beam and to remove a particle from the reticle or from an area adjacent the reticle; and
  a uniformity corrector between the masking blades and the particle collector,
  wherein the masking blades are configured to be charged to a bias voltage different from the electrostatic voltage,
  wherein the EUV source comprises:
    a droplet generator configured to provide generate a source droplet; and
    a laser device configured to periodically illuminate a laser beam into the source droplet based on the first pulse to generate the EUV beam,
  wherein the particle collector comprises a rotation disk chopper having a transmitting region and a blocking region for the EUV beam,
  wherein the transmitting region is configured to be rotated to have a second pulse that has a second period that is the same as a first period of the first pulse,
  wherein the transmitting region is provided on the reticle when the laser device turns on the laser beam to generate the EUV beam, and
  wherein the blocking region is provided on the reticle to remove the particle when the laser device turns off the laser beam to make the EUV beam disappear.

11. The system of claim 10, wherein the electrostatic voltage has a first pulse, and
  the bias voltage has a second pulse having a second period that is the same as a first period of the first pulse of the electrostatic voltage.

12. The system of claim 10, further comprising fluid nozzles between the masking blades and the reticle stage and configured to provide a fluid into a region between the reticle and the masking blades,
  wherein the fluid nozzles are configured to be charged to the bias voltage.

13. The system of claim 10, wherein the masking blades comprise:
  first and second masking blades facing each other and spaced apart in a first direction; and
  third and fourth masking blades facing each other and spaced apart in a second direction that is perpendicular to the first direction,
  wherein the system further comprises:
    a first ground electrode on the second masking blade and a second ground electrode on the fourth masking blade, and
    a first bias electrode on the first masking blade and a second bias electrode on the third masking blade.

14. A method of fabricating a semiconductor device, the method comprising:
  applying an electrostatic voltage to a reticle chuck of an exposure system;
  generating an EUV beam having an intensity of a first pulse;
  providing the EUV beam to a reticle;
  blocking a particle synchronized with the first pulse;
  applying a bias voltage to a masking blade of the exposure system to charge the masking blade;
  providing the EUV beam to a substrate using an optical system above or on the EUV source; and
  adjust uniformity of the EUV beam using a uniformity corrector,
  wherein generating the EUV beam including the intensity having the first pulse comprises:
    generating a source droplet; and
    using a laser device, periodically providing a laser beam into the source droplet based on the first pulse to generate the EUV beam,
  wherein the blocking of the particle comprises rotating a particle collector having a blocking region and a transmitting region, the transmitting region is rotated to have a second pulse, and the second pulse has a rotation period that is the same as a first period of the first pulse, wherein the transmitting region is provided on the reticle when the laser device turns on the laser beam to generate the EUV beam, wherein the blocking region is provided on the reticle to remove the particle when the laser device turns off the laser beam to make the EUV beam disappear, wherein the masking blade is between the reticle and the optical system, and wherein the uniformity corrector is between the masking blades and the particle collector.

15. The method of claim 14, wherein the blocking of the particle comprises inducing an electric field between a ground electrode and a bias electrode of a particle collector, and the bias electrode receives a second bias voltage having a third pulse that has a third period that is the same as a first period of the first pulse and has a third phase that is opposite to a first phase of the first pulse.

16. The method of claim 14, wherein the electrostatic voltage has a fourth pulse different from the first pulse, and the bias voltage has a fifth pulse having a fifth period that is the same as a fourth period of the fourth pulse and has a fifth phase that is opposite to a fourth phase of the fourth pulse.

17. The method of claim 14, further comprising applying the bias voltage to a fluid nozzle of the exposure system to electrically charge the fluid nozzle.

* * * * *